United States Patent
Drewery (12) 
(10) Patent No.: US 9,336,901 B2
(45) Date of Patent: May 10, 2016

(54) TRACK AND HOLD FEEDBACK CONTROL OF PULSED RF

(71) Applicant: Lam Research Corporation, Fremont, CA (US)

(72) Inventor: John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 66 days.

(21) Appl. No.: 14/215,600

(22) Filed: Mar. 17, 2014

(65) Prior Publication Data

US 2015/0262704 A1 Sep. 17, 2015

(51) Int. Cl.
*G11C 27/02* (2006.01)

(52) U.S. Cl.
CPC ........................................ *G11C 27/02* (2013.01)

(58) Field of Classification Search
USPC ....................................................... 327/94–95
See application file for complete search history.

(56) References Cited

U.S. PATENT DOCUMENTS 3,800,802 A * 4/1974 Berry et al. ...................... 607/64
3,953,849 A * 4/1976 Couvillon ...................... 342/100

* cited by examiner

*Primary Examiner* — An Luu
(74) *Attorney, Agent, or Firm* — Martine Penilla Group, LLP (57) ABSTRACT

A system and method of providing feedback control to a pulsed RF generator includes an RF generator having an RF output and a feedback input. An RF electrode is coupled to the RF output and an RF sampling circuit having a sampling input coupled to the RF electrode. The sampling circuit including a feedback signal output coupled to the feedback input of the RF generator. A method of providing feedback control to a pulse RF generator includes receiving an RF sample of an RF pulse, sampling the RF sample multiple sampling times to produce multiple feedback levels during the duration of the RF pulse and coupling the multiple feedback levels to a feedback input on an RF generator, the RF generator outputting the RF pulse.

17 Claims, 9 Drawing Sheets

TRACK AND HOLD FEEDBACK CONTROL OF PULSED RF

BACKGROUND

The present invention relates generally to semiconductor manufacturing processes, and more particularly, to methods and systems for controlling RF biasing in a process chamber.

Plasma processes are often improved by pulsing one or more parameters related to the plasma. By way of example, in a plasma etching system, a first RF source is used to form an inductively coupled RF plasma in a processing chamber. The RF plasma can then be used to etch a substrate. The substrate is typically placed on a substrate support in the processing chamber. A second RF source is often coupled to the substrate, through the substrate support, to create a negative voltage on the substrate.

Certain etching and other processes can be significantly improved by pulsing the negative voltage on the substrate at frequencies from between 1 Hz and 50 kHz. Typically, the peak voltage applied to the substrate is controlled via a filtered feedback loop. Applied bias voltages of 500V or higher are often used.

Further, some processes use a second level of pulsing in which pulsed bias is applied for time periods of a few seconds, removed and applied again, often in conjunction with other process parameters changing cyclically. This is referred to as mixed-mode pulsing (MMP). Unfortunately, the time periods of the mixed-mode pulsing are constantly being reduced to shorter and shorter time periods. The filtered feedback loop includes a time delay that can limit the accuracy and effectiveness of the feedback signal. There is a need for an improved feedback loop that minimizes the delay in the feedback loop and thus improve accuracy and effectiveness of the feedback signal and the switching of the mixed-mode pulsing.

SUMMARY

Broadly speaking, the present invention fills these needs by providing an improved pulsed RF feedback loop for pulsed plasma processes. It should be appreciated that the present invention can be implemented in numerous ways, including as a process, an apparatus, a system, computer readable media, or a device. Several inventive embodiments of the present invention are described below.

One embodiment provides a pulsed RF system including a pulsed RF generator having an RF output and a feedback input. An RF electrode is coupled to the RF output and an RF sampling circuit having a sampling input coupled to the RF electrode. The sampling circuit including a feedback signal output coupled to the feedback input of the RF generator.

The RF sampling circuit can include an exclusion time delay circuit delaying the output of the feedback signal until a selected exclusion time delay after an RF pulse is initially sampled. The RF sampling circuit can include a rectifier for rectifying a sampled RF signal.

The RF sampling circuit can also include a track and hold unit. The RF sampling circuit can also include an exclusion time delay circuit delaying the output of the feedback signal until a selected exclusion time delay after an RF pulse is initially sampled and the track and hold unit can include a trigger generator configured for generating multiple sampling trigger pulses after the exclusion time delay.

The track and hold unit can include a hold unit configured for holding a last sampled RF level after the RF pulse ends, the held RF level being held in the feedback signal output. The held RF level can be held until a subsequent RF pulse is received.

Another embodiment provides a method of providing feedback control to a pulse RF generator includes receiving an RF sample of an RF pulse, sampling the RF sample multiple sampling times to produce multiple feedback levels during the duration of the RF pulse and coupling the multiple feedback levels to a feedback input on an RF generator, the RF generator outputting the RF pulse.

The method can also include detecting a last feedback level after the RF pulse ends, holding the last feedback level and coupling the held last feedback level to the feedback input. Holding the last feedback level can include holding the last feedback level until a subsequent RF pulse is received.

Receiving the RF sample of the RF pulse can include rectifying the RF sample. The method can also include delaying an exclusion time delay after receiving the RF sample before sampling the RF sample. Receiving the RF sample can include receiving a synch pulse and delaying the exclusion time delay includes delaying the exclusion time delay after receiving the synch pulse before sampling the RF sample. Sampling the RF sample the multiple sampling times includes generating a sampling trigger for each one of the sampling times.

Yet another embodiment provides a pulsed RF system feedback circuit including an RF sampling circuit including a sampling input coupled to an RF electrode, a feedback signal output coupled to a feedback input of an RF generator and an exclusion time delay circuit delaying the output of the feedback signal until a selected exclusion time delay after an RF pulse is initially sampled.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for an improved pulsed RF feedback loop for pulsed plasma processes and methods will now be described. It will be apparent to those skilled in the art that the present invention may be practiced without some or all of the specific details set forth herein.

Voltage, power and/or current parameters of a pulsing RF can be controlled by monitoring one or more parameter of the RF pulse such as peak voltage, peak current or peak power. This approach can be very useful in instances where a relatively fast rise time for the monitored parameter is required. Monitoring a voltage parameter of the RF pulse, however, it should be understood that the current and/or power can be monitored in substantially the same manner and system to control the corresponding RF pulse voltage, current and/or power. The disclosed implementations provide stable voltage controlled operation of a class of processes that could not be run using typical pulsed RF control systems.

Figure 1A:
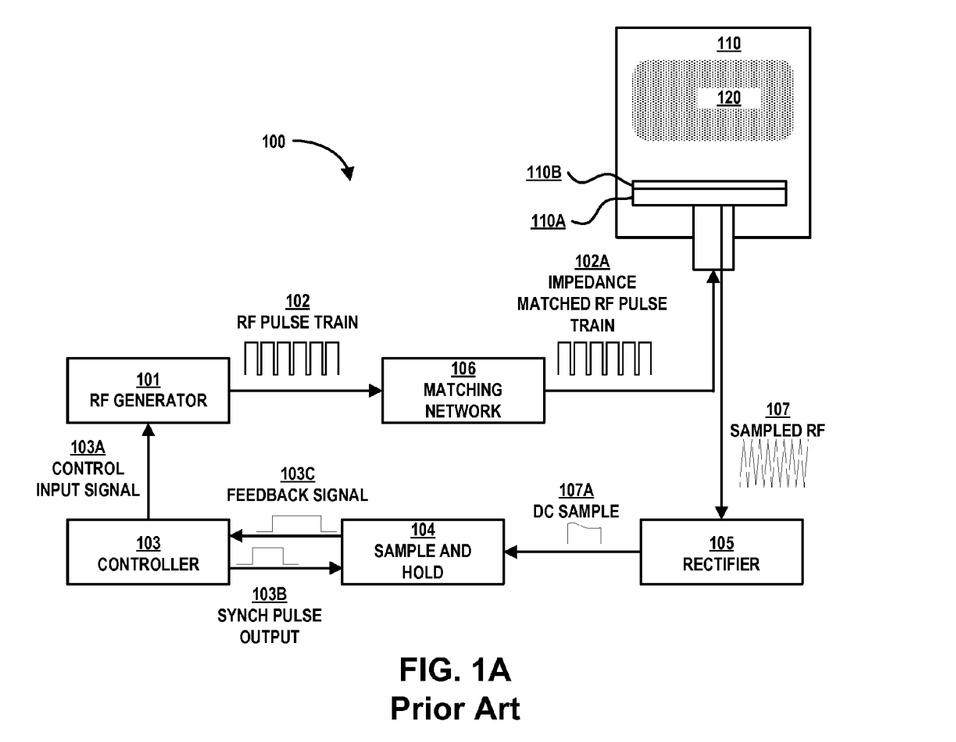
FIG. 1A is a typical pulsed RF processing system.

FIG. 1A is a typical pulsed RF processing system 100. A controller 103 sends a control signal 103A to an RF generator 101. The RF generator 101 then outputs an RF signal that can include a RF pulse train 102 (e.g., multiple RF pulses). The frequency, duty cycle and peak power of these pulses is determined by the controller 103. The RF pulse train 102 is input to a matching network 106. The matching network 106 matches the impedance of the chamber 110 and outputs an impedance matched RF pulse train 102A to the processing chamber 110.

A plasma 120 is formed in the chamber 110 for processing a substrate 110B. One or more parameters of the RF are sampled 107 from the substrate support 110A. The sampled RF parameter 107 can be a voltage, a current or a power. Alternately, the voltage, current and/or power on any RF component or electrode such as an excitation coil or any other component of the system could be measured. The sampled RF parameter 107 is output to rectifier 105, which rectifies the sampled RF parameter to produce a DC sample waveform 107A.

The DC sample waveform 107A is input to a sample and hold unit 104. The sample and hold unit 104 also receives a timing synch pulse output 103B from the controller 103. The sample and hold unit 104 outputs a feedback signal 103C to a feedback input of the controller 103.

Figure 1B:
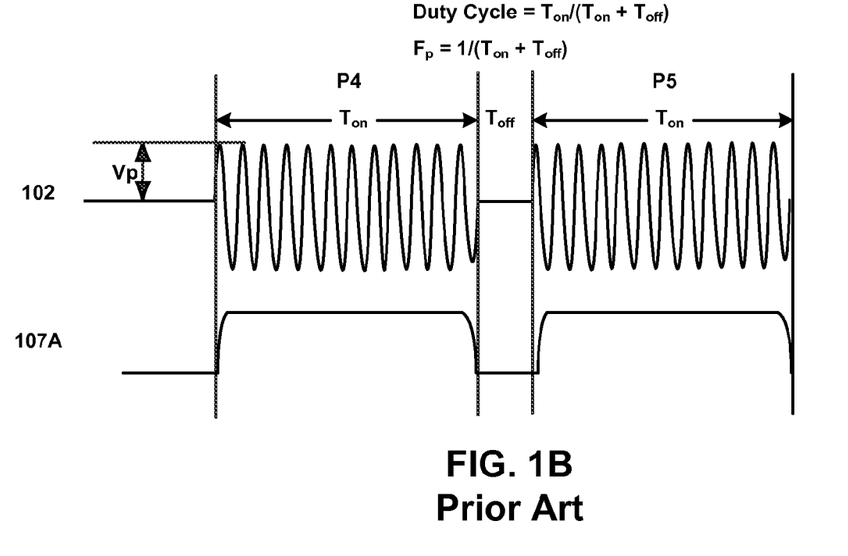
FIG. 1B is a detailed view of two pulses in the RF Pulse train.

FIG. 1B is a detailed view of two pulses in the RF Pulse train 102. Each pulse in the RF Pulse train 102 includes a first period $T_{on}$ during which the RF is on and a second period $T_{off}$ during which the RF is off. The typical duty cycle is $T_{on}$ having a duration between 1 and 99 percent of the full pulse duration Tp and $T_{off}$ having a duration equal to Tp-$T_{on}$. By way of example, a 50 Hz frequency with an 80 percent duty cycle would have the following values: Tp=1/50 seconds=20 msec, $T_{on}$=0.80*20 msec=16 msec and $T_{off}$=20 msec−16 msec=4 msec. In typical processes the pulses may have Vp=10-5000V, frequency 10 Hz-50 kHz and duty cycle 1% to 99%.

Figure 1C:
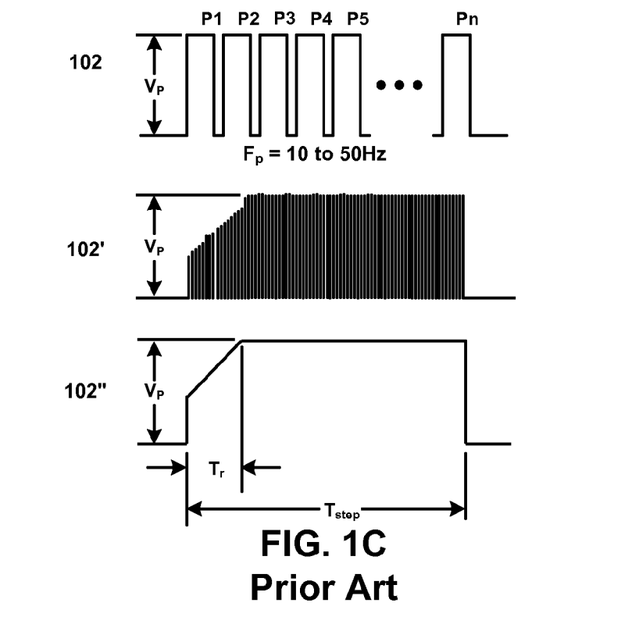
FIG. 1C is a graphical representation of an ideal pulse train the typical pulse train and a typical pulse train envelope during a selected process step time Tstep.

FIG. 1C is a graphical representation of an ideal pulse train 102 the typical pulse train 102' and a typical pulse train envelope 102" during a selected process step time Tstep. The ideal pulse train 102 includes multiple pulses P1-n having the full amplitude voltage Vp (or full current Ip or full power Pp) of the selected amplitude set point.

Unfortunately, a rise time delay Tr occurs at the beginning of each process step time Tstep resulting in the typical pulse train 102', where each vertical line represents at least one pulse. The typical pulse train envelope 102" more clearly illustrates the rise time delay Tr. The amplitude of the pulses gradually builds to the full set point amplitude Vp during the rise time delay Tr. The rise time delay Tr is typically between about 2 and about 10 seconds. It should be noted that while only a few pulses are shown during the rise time delay Tr, in FIG. 1C, typically many more pulses occur during the rise time delay. By way of example, if the pulse frequency is 50 Hz and the rise time delay Tr has a duration of 5 seconds, then approximately 250 pulses will occur during the rise time delay.

Figure 1D:
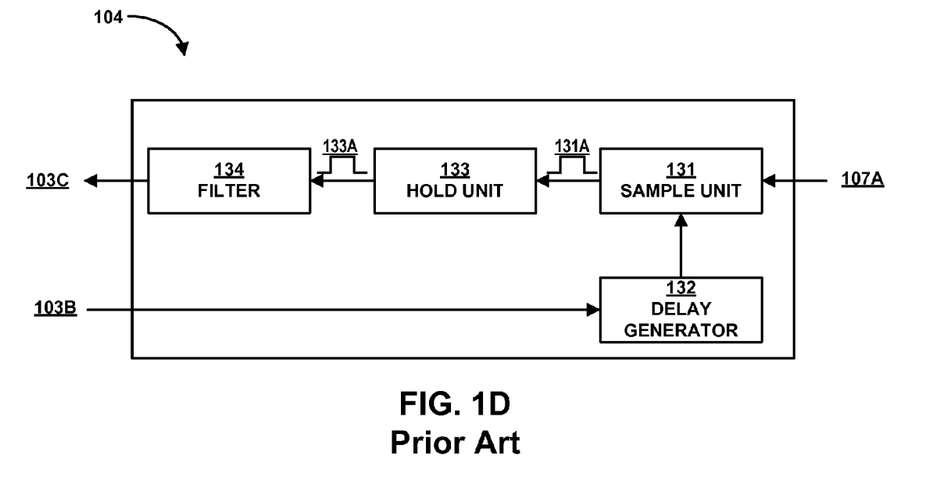
FIG. 1D is a block diagram of a typical sample and hold unit.
Figure 1E:
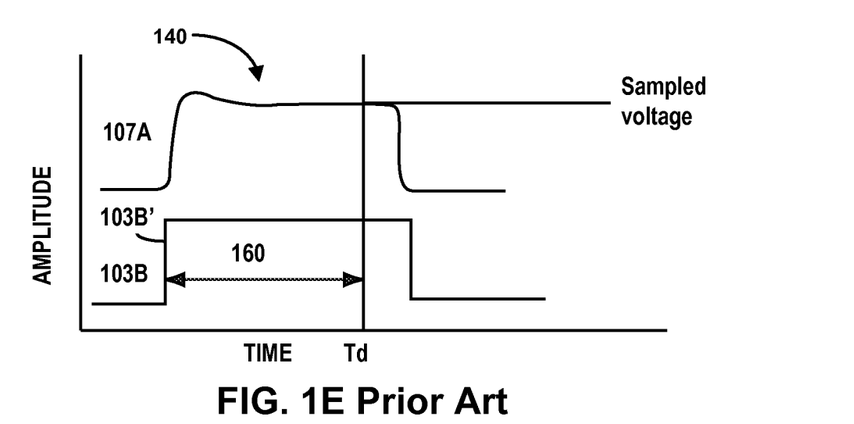
FIG. 1E is a graph of the output waveforms during a typical mixed mode process.

The rise time delay Tr is caused by the feedback regimen used in the typical pulsed RF processing system 100. FIG. 1D is a block diagram of a typical sample and hold unit 104. The sample and hold unit 104 includes a sample unit 131, a hold unit 133, a filter 134 and a delay generator 132. FIG. 1E is a graph 140 of the output waveforms during a typical mixed mode process. The waveforms include the rectified RF sample 107A, a synchronization pulse 103B in phase with the pulse train 102, which is separately produced for example by the RF generator 101.

A time delay 160 is initiated by a rising edge 103B' of synch pulse 103B. After the time delay 160, the rectified RF sample 107A is sampled one time per cycle by the sample unit 131. The hold unit 133 holds that sampled level until the next sample is received during the next pulse train.

Figure 1F:
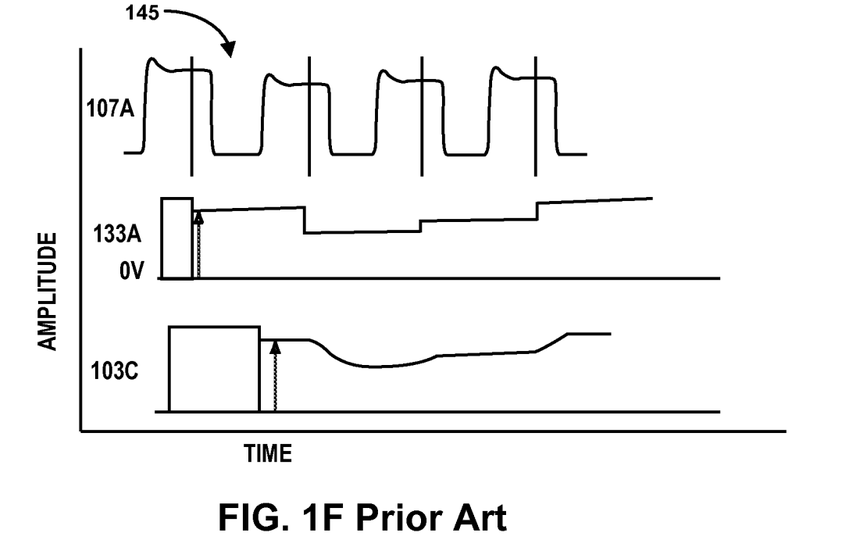
FIG. 1F is a graph of several cycles of sample and hold during a typical mixed mode process.

FIG. 1F is a graph 145 of several cycles of sample and hold during a typical mixed mode process. Over time, the output 133A of the hold unit 133 appears as a staircase where each step corresponds to the level detected at the end of each time delay 160. The resulting staircase appearing output 133A may be filtered by filter 134 to produce the sloped feedback signal 103C. The feedback signal 103C is read by the controller 103. The controller 103 calculates and updates the power setpoint sent to the generator 101 in response to the feedback signal 103C.

The software running in the controller 103 compares the feedback signal 103C with a desired setpoint and increases or decreases the RF generator 101 power accordingly. The RF generator 101 power is typically updated about 20 times per second. Because this update rate is quite slow, the algorithm responds relatively slowly to step changes in the setpoint. The voltage may not reach setpoint for up to 5 seconds after the setpoint change (e.g., time Tr discussed above in FIG. 1C).

Figure 2A:
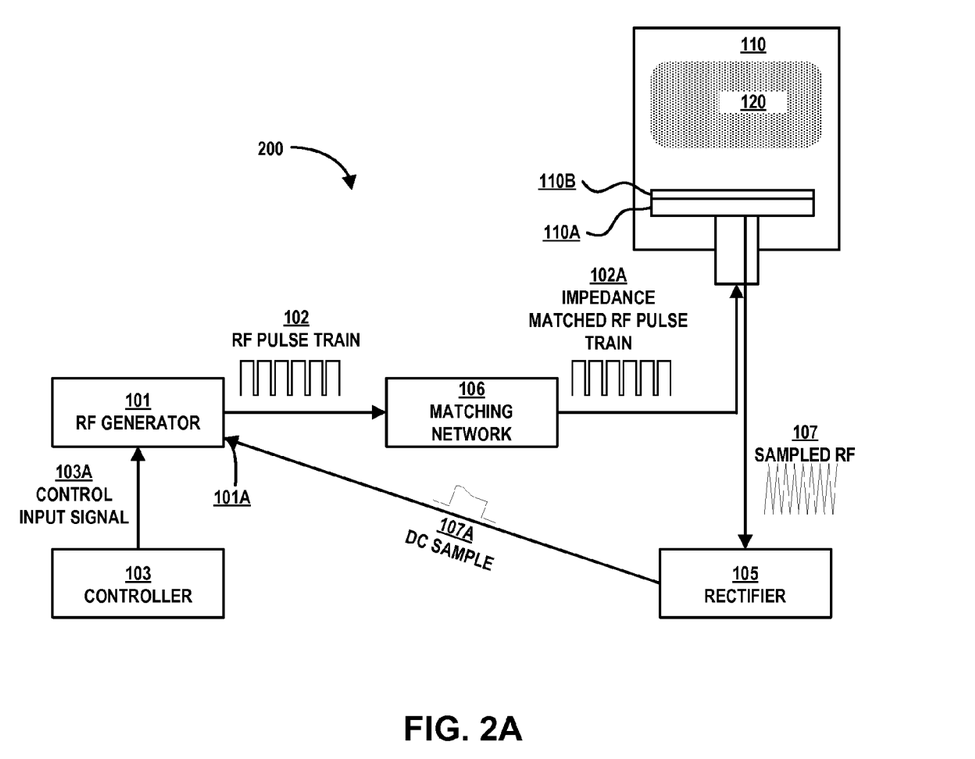
FIG. 2A is a block diagram of a pulsed RF processing system with an improved feedback system, for implementing embodiments of the present disclosure.

As a result, there is a need for an improved method of controlling the amplitude of the RF pulse train 102 output of the RF generator 101. FIG. 2A is a block diagram of a pulsed RF processing system 200 with an improved feedback system, for implementing embodiments of the present disclosure. The improved feedback system couples the feedback signal directly to an external feedback input control 101A on the RF generator 101. The feedback signal bypasses the controller 103.

The RF generator 101 is sent an amplitude (e.g., voltage, current, power) setpoint by the controller 103. The RF generator 101 then compares the feedback signal on the feedback pin 101A with the setpoint and adjusts the amplitude of the output RF pulse train 102. The RF generator 101 includes circuits for comparing the setpoint to the feedback signal. The RF generator can adjust the output amplitude at a high rate. By way of example, response to voltage setpoint changes can occur as quickly as less than 0.1 s and a very stable voltage output can be produced.

Unfortunately such fast response can also cause oscillations in the feedback system. An RF generator 101 capable of reaching a 90% setpoint in 50 ms for example must have considerable gain in the frequency region 10-100 Hz, the same region in which pulsing is occurring. In general a feedback system will exhibit oscillations at a frequency f if the total loop gain is greater than or equal to 1 and the phase shift around the loop is $2\pi m$ for that frequency, where m is an integer.

In practice, RF generators commonly used to supply bias RF power show a phase shift of approximately $-\pi/2$ radians at frequencies between the voltage feedback input and the power output for frequencies in the range between 10 Hz and 100 Hz. As a result, phase shifts for signals in this frequency region are preferably limited to less than $\pi/2$, to avoid oscillation. The difference between the phase shift at which oscillation may occur and the actual phase shift under given conditions is referred to as the 'phase margin'.

In most applications one desires both the pulse envelope shown in FIG. 1B and the envelope of all the pulses in FIG. 1C to exhibit a rapid rise and fall time and a constant amplitude value during the 'on' period. This leads to precise control of for example etch processes with the possibility of short process steps. The recently developed mixed mode pulsing (MMP) processes require step times of 5 s and shorter. This means that it is desirable for the envelope 102" to have a rise time Tr of 0.5 s or shorter.

Figure 2B:
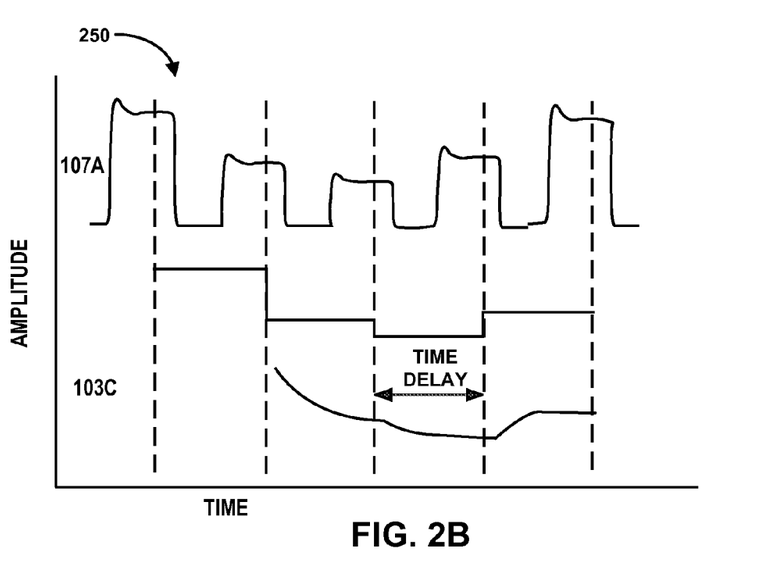
FIG. 2B is a detailed view of a portion of the of the output waveforms during a mixed mode process in the pulsed RF processing system, for implementing embodiments of the present disclosure.

Recall the operations of the behavior of the sample/hold unit 104, as described above, when sampling a voltage that has a periodic perturbation. FIG. 2B is a detailed view of a portion of the of the output waveforms during a mixed mode process in the pulsed RF processing system 200, for implementing embodiments of the present disclosure. While a detailed analysis of the sample/hold unit 104 is complex, it can be seen that the sample/hold unit 104 introduces a signal delay of up to one pulse cycle depending on the exact phase of the perturbation with respect to the pulse train. This is a phase delay of approximately $2f/fp \cdot \pi$ radians for a sampling (i.e. pulse) frequency of fp. Accordingly, perturbations with frequency ¼ the pulse frequency are at considerable risk of instability. For pulse frequencies of 100 Hz, for example, a 25 Hz oscillation may be possible if the magnitude of the loop gain is above unity. High loop gain is needed at 100 Hz to allow for voltage transitions in 50 ms. Further, due to the sampling, any structure of the perturbation with frequency above fp/2 will not be measured. This leads to the possibilities of oscillation at frequencies that are multiples of fp or oscillation due to inadequate phase margin caused by the phase delay mentioned. In practice it has been found that oscillation at multiples of the pulse frequency is not likely, but the oscillations at low frequencies have been observed in practice and are very harmful to process performance.

Phase margin may be further eroded by a number of factors. Additional low-pass filtering in the voltage loop reduces phase margin. Other components in the bias system, such as the matching network 106, may react in such a way as to delay the voltage rise on the substrate 101B as further power is applied. Certain process conditions, specifically certain plasma chemistries, may also cause an effective phase shift due to the non-linear dynamics of formation of plasma sheaths. Accordingly certain processes may exhibit oscillation of the bias voltage while others do not.

One approach to resolving the above issues is to provide a feedback signal without the effective delay caused by the sampling circuits. The rectified sample 107A of the sampled can be used as the feedback signal, and for the generator 101 feedback control system to ignore the feedback signal if no RF power is present. However, the feedback signal returns to zero during the off cycle of the pulse and must rise from zero at the start of the pulse. The rectified sample 107A is also low pass filtered and several time constants of filtering must pass before a stable feedback signal is available to control the RF voltage. In practice this leads to voltage offsets between the desired voltage and the actual output of the RF generator 101.

Figure 3A:
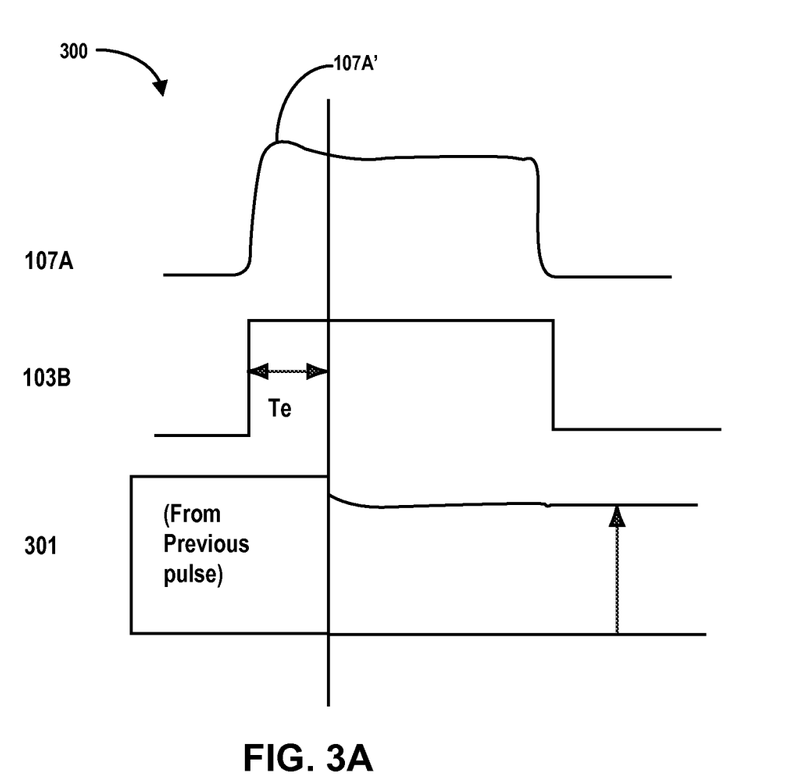
FIG. 3A is a graphical representation of the track and hold methodology for implementing embodiments of the present disclosure.

A further improved approach is to use a track and hold methodology to provide the feedback signal to the RF generator 101. FIG. 3A is a graphical representation 300 of the track and hold methodology for implementing embodiments of the present disclosure. The rectified RF sample 107A is the input to a track and hold circuit. During an 'off' portion of the RF pulse, the feedback signal 301 is held at either of two values. If the system has been transitioned from a continuous wave to a pulsed operation less than one pulse period previously, the feedback signal 301 is held at the value of the CW amplitude of the RF signal at the time the system transitioned to pulsing operation. Otherwise, the feedback signal 301 is held at a value corresponding to the RF amplitude when the last pulse transition from 'on' to 'off' occurred.

The feedback signal 301 is held constant during an exclusion time Te at the start of an RF pulse. The exclusion time Te is used to eliminate effects due to transients 107A' as the RF pulse begins. After the exclusion period and continuing until the RF pulse ends, the rectified RF sample 107A is passed through essentially unchanged with minimal delay to the feedback input 101A of the RF generator 101.

As a result minimal phase delay is introduced by the feedback system during times when the RF generator 101 needs to control the pulse such as when the RF power is on and stable. The signal does not return to zero between pulses and thus there is no or at least a very minimal loss of precision arising from the need for the signal to rise to a stable value at the RF pulse start.

Figure 3B:
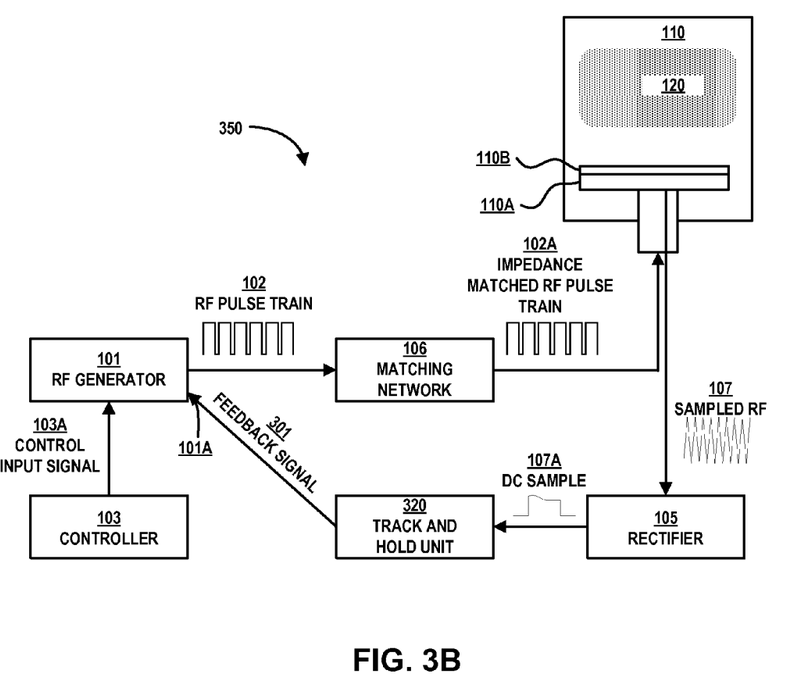
FIG. 3B is a block diagram of a pulsed RF processing system including a track and hold unit, for implementing embodiments of the present disclosure.
Figure 3C:
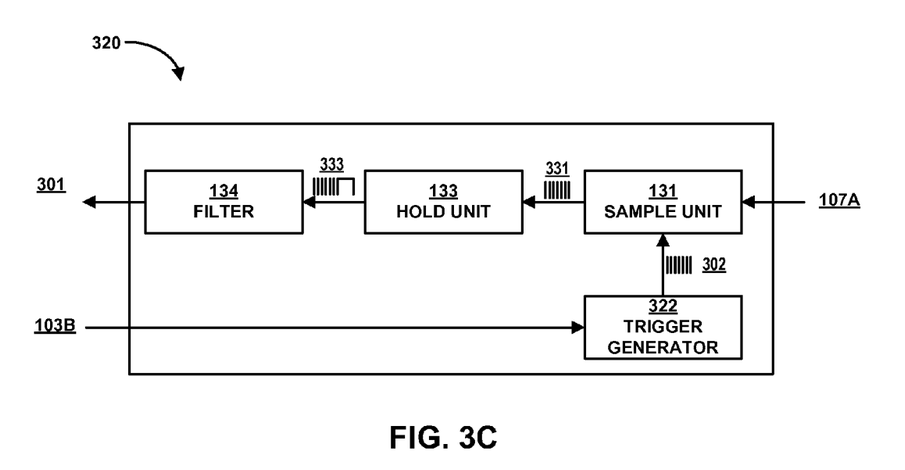
FIG. 3C is a block diagram of a track and hold unit for implementing embodiments of the present disclosure.

FIG. 3B is a block diagram of a pulsed RF processing system including a track and hold unit 320, for implementing embodiments of the present disclosure. FIG. 3C is a block diagram of a track and hold unit 320 for implementing embodiments of the present disclosure. The track and hold unit 320 is similar to the sample and hold unit 104 described above, however, instead of the delay generator 132, the track and hold unit includes a trigger generator 322.

The sample unit 131 and the hold unit 133 operate similar to the description above in FIG. 1D. One difference is the sampling. Rather than the rectified RF sample 107A being sampled only once during each RF pulse as described in FIG. 1D, the rectified RF sample is repeatedly sampled, as determined by the trigger generator 322, after the exclusion time Te, for as long as the pulse synchronization signal 103B is present at the synchronization input.

Figure 3D:
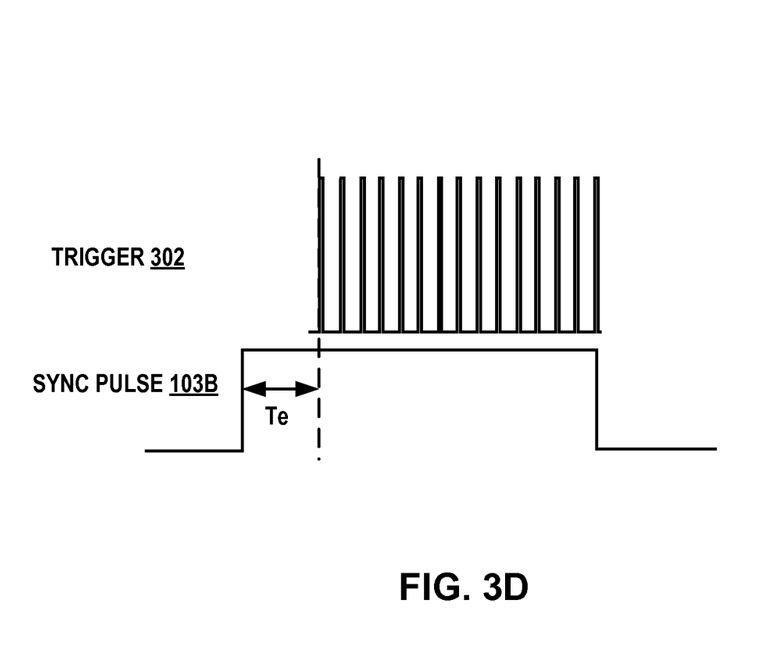
FIG. 3D is a graph of the synchronization signal and the trigger signal, for implementing embodiments of the present disclosure.

FIG. 3D is a graph of the synchronization signal 103B and the trigger signal 302, for implementing embodiments of the present disclosure. The trigger generator 322 receives the synchronization signal 103B and delays for the exclusion time Te. After the exclusion time Te, the trigger generator 322 generates sampling trigger signal 302. Sampling can be performed at intervals between triggers of between about 100 ns and up to about 10% of the pulse length. More preferably, the sampling occurs at about 2 microsecond intervals.

The exclusion time Te may be between about zero to the pulse length. More preferably, the exclusion time Te is about 20% of the pulse width. The foregoing are merely examples and other implementations are also possible.

Another approach can use an analog switch to route the rectified RF sample 107A, unchanged, to the feedback input 101A, after the exclusion time Te, with the sample unit 131 and hold unit 133 triggered once at the end of the pulse. There are also a number of commercially available track/hold integrated circuits, for example the MAX 101A available from Maxim integrated circuits of Sunnyvale, Calif., which may be adapted to provide the feedback signal required when used in conjunction with suitable gating circuitry.

Figure 4:
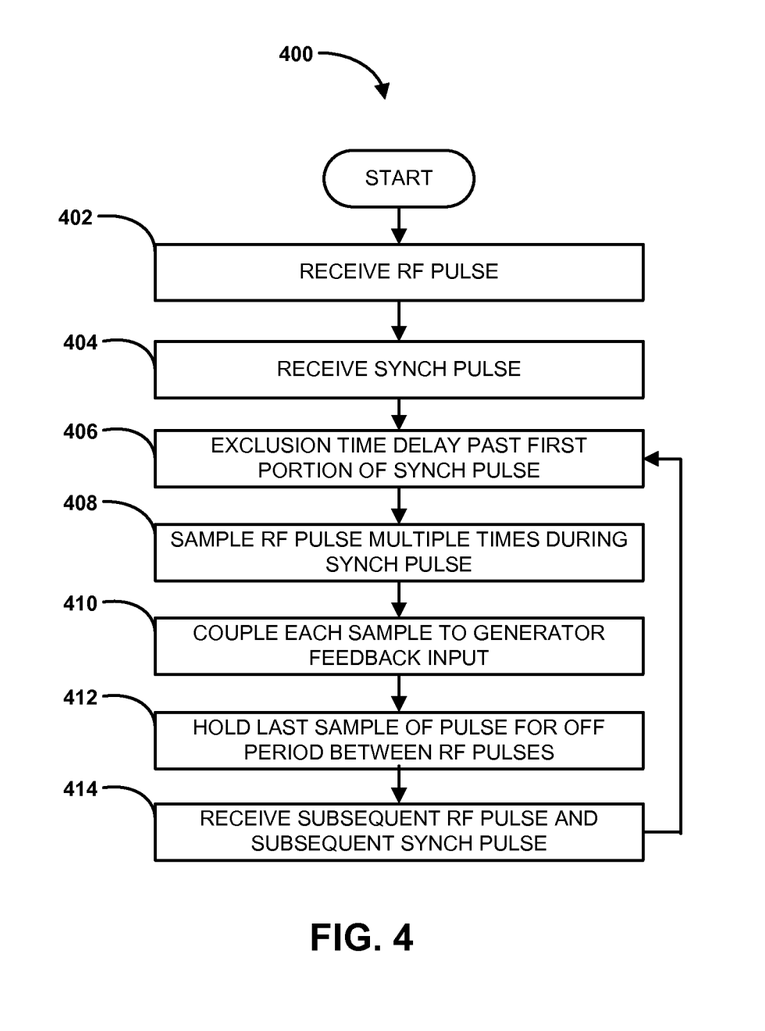
FIG. 4 is a flowchart diagram that illustrates the method operations performed in providing a track and hold feedback signal to the RF generator, for implementing embodiments of the present disclosure.

FIG. 4 is a flowchart diagram that illustrates the method operations 400 performed in providing a track and hold feedback signal 301 to the RF generator 101, for implementing embodiments of the present disclosure. In an operation 402, an RF pulse train 102 is output from the RF generator 101. The RF is sampled and the RF sample 107 is rectified to a DC component of the sampled RF to produce a rectified RF sample 107A.

In an operation 404, the synchronization pulse 103B is received in the trigger generator 322. In an operation 406, the trigger generator 322 delays for the exclusion time Te after receiving the synchronization pulse 103B.

In an operation 408, the rectified RF sample 107A is sampled multiple times during the remaining duration of the synchronization pulse 103B. The trigger generator 322 generates trigger signal 302 at a selected frequency. The sample unit 131 samples the rectified RF sample 107A one time for each trigger signal pulse 302 to produce a triggered sample signal 322. In an operation 410, each triggered sample signal 322 is coupled directly to the feedback input 101A of the RF generator 101.

In an operation 412, the synchronization pulse 103B ends and the hold unit 133 holds the hold unit output signal 333 at the level of the last trigger signal pulse 302. The hold unit output signal 333 is coupled to the feedback input 101A of the RF generator 101. The hold unit output signal 333 can optionally be filtered in a filter unit 134. In an operation 414, a subsequent RF pulse and a subsequent synchronization pulse is received and the method operations continue in operation 406 as described above.

Figure 5A:
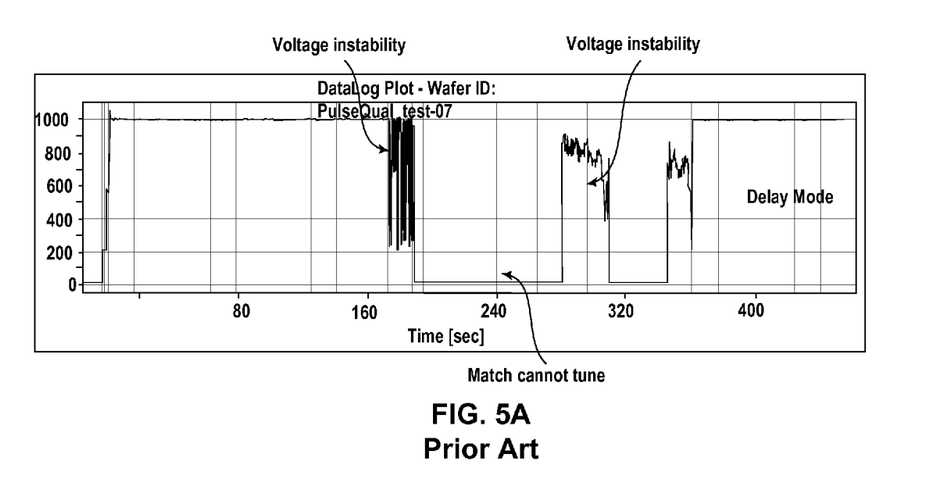
FIG. 5A is a graph of a bias voltage for a typical pulsed RF etch process. The RF voltage measured during the 'pulse on' condition.

FIG. 5A is a graph 500 of a bias voltage for a typical pulsed RF etch process. The RF voltage measured during the 'pulse on' condition. A silicon wafer was etched in a pressure of 5 mT of Cl2 which was flowed into a Kiyo FX chamber at a rate of 100 sccm. 400W of TCP power was applied and pulsed bias at 100 Hz with 15% duty cycle was applied. The target operation voltage was 850V. Stable bias voltage was not obtained.

Figure 5B:
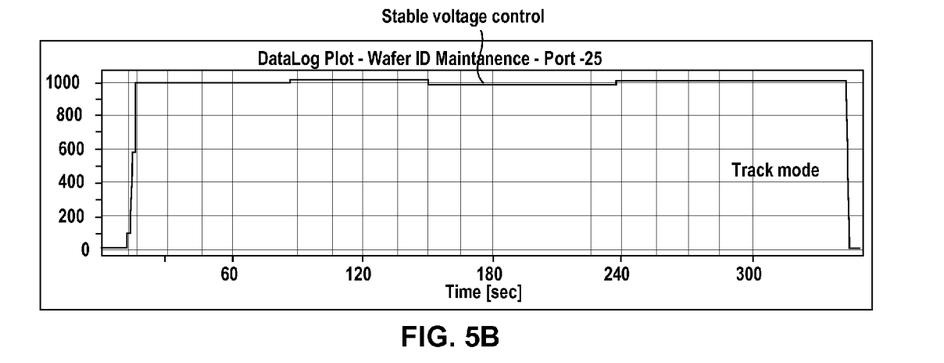
FIG. 5B is a graph of a bias voltage for a pulsed RF etch process using the track and hold feedback, for implementing embodiments of the present disclosure.

FIG. 5B is a graph 550 of a bias voltage for a pulsed RF etch process using the track and hold feedback, for implementing embodiments of the present disclosure. The track and hold feedback signal 301 was used to provide voltage feedback and stable operation was achieved.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A pulsed RF system comprising:
    an RF generator having an RF output and a feedback input;
    an RF electrode coupled to the RF output; and
    an RF sampling circuit having a sampling input coupled to the RF electrode, the sampling circuit including a feedback signal output coupled to the feedback input of the RF generator;
    wherein the RF sampling circuit includes an exclusion time delay circuit delaying the output of the feedback signal until a selected exclusion time delay after an RF pulse is initially sampled.

2. The system of claim 1, wherein the RF sampling circuit includes a rectifier for rectifying a sampled RF signal.

3. A pulsed RF system comprising:
    an RF generator having an RF output and a feedback input;
    an RF electrode coupled to the RF output; and
    an RF sampling circuit having a sampling input coupled to the RF electrode, the sampling circuit including a feedback signal output coupled to the feedback input of the RF generator;
    wherein the RF sampling circuit includes a track and hold unit;
    wherein the RF sampling circuit includes:

an exclusion time delay circuit delaying the output of the feedback signal until a selected exclusion time delay after an RF pulse is initially sampled; and wherein the track and hold unit includes a trigger generator configured for generating a plurality of sampling trigger pulses after the exclusion time delay.

4. The system of claim 3, wherein the track and hold unit includes a hold unit configured for holding a last sampled RF level after the RF pulse ends, the held RF level being held in the feedback signal output.

5. The system of claim 4, wherein the held RF level being held until a subsequent RF pulse is received.

6. Method of providing feedback control to a pulse RF generator comprising:

receiving an RF sample of an RF pulse;

sampling the RF sample a plurality of sampling times to produce a plurality of feedback levels during the duration of the RF pulse;

coupling the plurality of feedback levels to a feedback input on an RF generator, the RF generator outputting the RF pulse; and delaying an exclusion time delay after receiving the RF sample before sampling the RF sample.

7. The method of claim 6, further comprising:

detecting a last feedback level after the RF pulse ends;

holding the last feedback level; and coupling the held last feedback level to the feedback input.

8. The method of claim 7, wherein holding the last feedback level includes holding the last feedback level until a subsequent RF pulse is received.

9. The method of claim 6, wherein receiving the RF sample of the RF pulse includes rectifying the RF sample.

10. The method of claim 6, wherein receiving the RF sample includes receiving a synch pulse and delaying the exclusion time delay includes delaying the exclusion time delay after receiving the synch pulse before sampling the RF sample.

11. A method of providing feedback control to a pulse RF generator comprising:

receiving an RF sample of an RF pulse;

sampling the RF sample a plurality of sampling times to produce a plurality of feedback levels during the duration of the RF pulse; and coupling the plurality of feedback levels to a feedback input on an RF generator, the RF generator outputting the RF pulse;

wherein sampling the RF sample the plurality of sampling times includes generating a sampling trigger for each one of the plurality of sampling times.

12. A pulsed RF system feedback circuit comprising an RF sampling circuit including:

a sampling input coupled to an RF electrode;

a feedback signal output coupled to a feedback input of an RF generator; and an exclusion time delay circuit delaying the output of the feedback signal until a selected exclusion time delay after an RF pulse is initially sampled.

13. The system of claim 12, wherein the RF sampling circuit includes a rectifier for rectifying a sampled RF signal.

14. The system of claim 12, wherein the RF sampling circuit includes a track and hold unit.

15. The system of claim 14, wherein the RF sampling circuit includes:

an exclusion time delay circuit delaying the output of the feedback signal until a selected exclusion time delay after an RF pulse is initially sampled; and wherein the track and hold unit includes a trigger generator configured for generating a plurality of sampling trigger pulses after the exclusion time delay.

16. The system of claim 15, wherein the track and hold unit includes a hold unit configured for holding a last sampled RF level after the RF pulse ends, the held RF level being held in the feedback signal output.

17. The system of claim 16, wherein the held RF level being held until a subsequent RF pulse is received.

* * * * *